United States Patent [19]

Minakata et al.

[11] Patent Number: 4,699,702
[45] Date of Patent: Oct. 13, 1987

[54] PROCESS FOR PREPARING SOFT MAGNETIC FILM OF PERMALLOY

[75] Inventors: Ryoji Minakata, Yamatokoriyama; Toru Kira, Tenri; Mitsuhiko Yoshikawa, Ikoma, all of Japan

[73] Assignee: Sharp Kabushiki Kaisha, Osaka, Japan

[21] Appl. No.: 906,459

[22] Filed: Sep. 12, 1986

[51] Int. Cl.[4] .............................................. C23C 14/00
[52] U.S. Cl. ............................ 204/192.2; 204/192.15; 204/298
[58] Field of Search ........................ 204/192.2, 192.15

[56] References Cited

U.S. PATENT DOCUMENTS

| 3,361,659 | 1/1968 | Berteisen | 204/192.2 |
| 3,625,849 | 12/1971 | Rogalla | 204/192.2 |
| 3,716,472 | 2/1973 | Kausche | 204/192.2 |
| 4,159,909 | 7/1979 | Wilson | 204/192.2 |
| 4,484,995 | 11/1984 | Pirich et al. | 204/192.2 |
| 4,487,675 | 12/1984 | Meckel | 204/192.2 |

OTHER PUBLICATIONS

Meckel et al, Research Disclosure; Oct.; 1979, pp. 537–540.

Primary Examiner—Arthur P. Demers
Attorney, Agent, or Firm—Stiefel, Gross, Kurland & Pavane

[57] ABSTRACT

A process for preparing a soft magnetic film of Permalloy on a rugged substrate in an inert gas atmosphere by a multielectrode sputtering method wherein the target voltage and the target current are independently controllable, the Permalloy film being prepared by:
(a) setting the inert gas pressure and the target voltage at values below the critical values where the coercive force of the Permalloy film abruptly increases when the film is formed on a flat substrate, and
(b) applying to the rugged substrate during film formation a negative bias voltage not lower than a specific value determined by an angle of inclination formed by a stepped portion in the rugged substrate.

8 Claims, 8 Drawing Figures

PROCESS FOR PREPARING SOFT MAGNETIC FILM OF PERMALLOY

BACKGROUND OF THE INVENTION

1. Field of the Invention

The present invention relates to a process for preparing a soft magnetic film of Permalloy for use as the magnetic core of a thin film magnetic head or the like, and more particularly to a technique for preparing a soft magnetic film of Permalloy in an inert gas atmosphere by the multielectrode sputtering method.

2. Description of the Prior Art

A soft magnetic film of Permalloy is used for the magnetic core of a thin film magnetic head which is employed as the magnetic recording-reproduction means in the field of audio, video and other magnetic data processing. Generally, the Permalloy film has heretofore been prepared by electro-plating.

However, with the development of semiconductor techniques in recent years, the sputtering method has been positively discussed for use in preparing films. Although the plating method requires an electrically conductive ground layer for plating and use of an agent for mitigating the stress in the film, the sputtering method forms compact films without necessitating these means. Furthermore, the sputtering method forms a film of high purity free from the above agent or other additives on a ground layer for which a wide variety of materials are usable.

The radio-frequency diode sputtering method is usually employed for forming films by sputtering. With this method, the input power is controlled for setting the electrical condition, so that the target voltage and the target current for sputtering can not be controlled independently of each other. On the other hand, it is already known that when Permalloy films are formed in argon or like inert gas pressure by the sputtering method, the magnetic properties of the film vary with high sensitivity according to the conditions, such as argon gas pressure and target voltage, set for sputtering. Thus, the radio-frequency diode sputtering method encounters difficulties in preparing Permalloy films of specified excellent magnetic properties with good reproducibility.

To overcome these drawbacks, a multielectrode sputtering method has already been proposed in which the target voltage and the target current are independently controllable. Permalloy films having outstanding magnetic properties and uniaxial anisotropy can be prepared by this method with good reproducibility, by controlling the pressure of inert gas and setting the target voltage at a value below the threshold voltage where the coercive force of the Permalloy film increases abruptly.

It has also been proposed to alter the magnetic properties and crystalline structure of the Permalloy film to be formed by applying a negative bias voltage to the substrate during sputtering. (C. S. Cargill III, S. R. Herd, W. E. Krull and K. Y. Ahn, "Structure-Sensitive Magnetic Properties of R.F. Sputtered Ni-Fe Films," IEEE Trans. Magn., Vol. MAG-15, no. 6, pp. 1821-1823, November, 1979; Y. Hoshi, M. Kojima, M. Naoe and S. Yamanaka, "Preparation of Permalloy Films by Using Targets Facing Type of High Rate and Low Temperature Sputtering Method," Trans. IECE Japan, Vol. J65-C, no. 10, pp. 783-790, October, 1982, in Japanese)

The conventional methods, including those described above, for preparing Permalloy films form the film on a flat substrate. However, when the Permalloy film is to be actually used as the magnetic core of a thin film magnetic head or the like, the magnetic core of Permalloy film, as indicated at 5 in FIG. 1, is prepared using a magnetic substrate 1 of Ni-Zn ferrite, Mn-Zn ferrite or the like, or a nonmagnetic substrate coated with Permalloy or Sendust, after forming an insulating layer 2 of $SiO_2$ or the like over the substrate, providing a winding conductor 3 of Cu, Al or the like on the layer 2 and further forming a second insulating layer 4 of $SiO_2$ or the like over the conductor 3. Accordingly, the ground layer over which the Permalloy film is formed is not planar but is a rugged surface having stepped portions. For example, the Permalloy film is formed also over slopes as indicated at a and b in FIG. 1. It is well known that when the Permalloy film is formed over such slopes by vacuum evaporation or sputtering, oblique impingement of the particles to be deposited on the substrate impairs the magnetic properties of the Permalloy film. This entails the problem that the magnetic core constituting the magnetic circuit of the magnetic head locally has increased magnetic resistance, which reduces the efficiency of the magnetic head.

SUMMARY OF THE INVENTION

The main object of the present invention, which has been accomplished in view of the foregoing problems, is to provide a process for preparing a novel and useful soft magnetic film of Permalloy with outstanding magnetic properties and with good reproducibility even on a rugged substrate having stepped slope portions.

Accordingly, the present invention provides a process for preparing a soft magnetic film of Permalloy on a rugged substrate in an inert gas atmosphere by a multielectrode sputtering method wherein the target voltage and the target current are independently controllable, the Permalloy film being prepared by:

(a) setting the inert gas pressure and the target voltage at values below the critical values where the coercive force of the Permalloy film abruptly increases when the film is formed on a flat substrate, and (b) applying to the rugged substrate during film formation a negative bias voltage not lower than a specific value determined by an angle of inclination formed by a stepped portion in the rugged substrate.

According to the present invention, Permalloy films having outstanding magnetic properties can be prepared with good reproducibility by controlling the target voltage and the inert gas pressure for sputtering within specified ranges and further applying a specified negative bias voltage to the substrate. The present process is suited to quantity production since the sputtering conditions are controllable without precision.

DESCRIPTION OF THE PREFERRED EMBODIMENT

Figure 1:
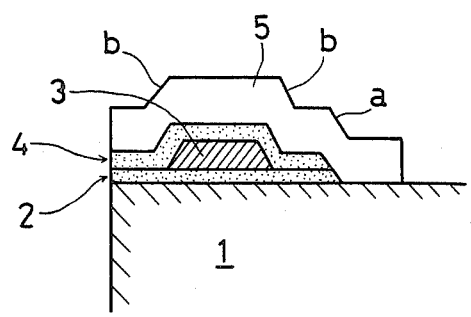
FIG. 1 is a diagram showing the structure of a thin film magnetic head to which the present invention is applied as an example.

The sputtering methods which are useful for the present invention and in which the target voltage and the target current are controllable independently of each other include, for example, d.c. triode sputtering method and d.c. tetrode sputtering method. While argon gas is generally used as the inert gas for sputtering, other inert gases such as neon gas are also usable.

On the other hand, Ni-Fe two-element Permalloy is typical of Permalloys for use as the sputtering target. Also usable are multi-element Permalloy targets containing Mo, Ti, Cr, V or Nb in addition to Ni and Fe, and composite targets comprising such targets.

The inert gas pressure and the target voltage greatly influence the coercive force Hc of the Permalloy film to be formed. According to the present invention, each of the inert gas pressure and the target voltage is controlled to a value below the critical value where the coercive force of the Permalloy abruptly increases when the film is formed on a flat substrate. The critical value, which is dependent on the sputtering apparatus actually used, is determined with reference to the magnetic characteristics curve prepared for the particular apparatus by measurement, as will be exemplified in Example to be given later. From this viewpoint, the target voltage is usually up to 500 V, preferably 200 to 400 V, while the inert gas pressure is up to 6 mtorr, preferably 2 to 4 mtorr.

It is known that the magnetic characteristics of the Permalloy film are not dependent on the target current when the target voltage and the argon gas pressure for sputtering are set below the critical values on the magnetic characteristics curves concerned. Accordingly the input power can be increased to achieve a higher film forming rate by increasing the target current at a low target voltage setting.

The negative bias voltage to be applied to the rugged substrate according to the present invention is set to a level not lower than a specific value which is determined by the angle of inclination of a slope on the substrate. The term "specific value" refers to the lowest voltage applied at which the Permalloy film obtained exhibits an approximately definite low value of coercive force. When no bias voltage is applied, the Permalloy film formed on the rugged substrate is exceedingly greater in coercive force Hc than the film formed on a flat substrate. However, we have found that the coercive force Hc gradually decreases with an increase in the substrate bias voltage and reaches a constant value when the voltage exceeds a certain value, the coercive force Hc thus achieved being almost comparable to that of the Permalloy film formed on a flat substrate having no slope. We have also found that such specific value, although varying with the sputtering condition, is dependent on the angle of inclination of the slope on the rugged substrate. For example, the specific value is usually in the range of from 60 to 100 V when the angle of inclination is 40 to 50 degrees, and the specific value increases or decreases in corresponding relation to an increase or decrease in the angle of inclination. Therefore, the specific value, i.e. the lowest negative bias voltage, can be determined for various rugged substrates having different angles of inclination in accordance with the dependence of the negative bias voltage-coercive force characteristics on the angle of inclination established under predetermined sputtering conditions.

If the rugged substrate has slopes of two or more different angles of inclination, the negative bias voltage may be controlled based on the largest angle of inclination.

EXAMPLE 1

(A) Apparatus

Figure 2:
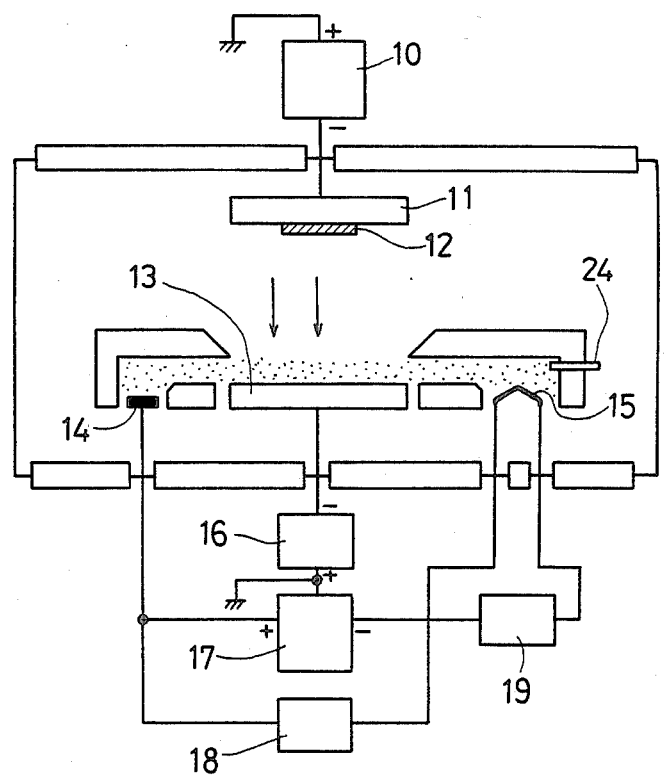
FIG. 2 is a diagram showing a sputtering apparatus used in Examples.
Figure 3:
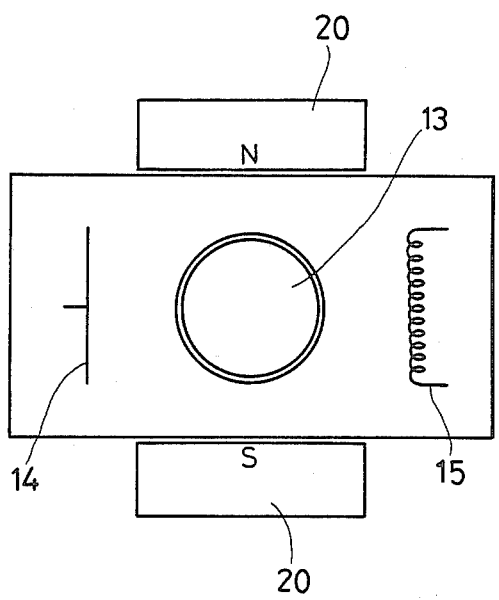
FIG. 3 is a plane view schematically showing the apparatus of FIG. 2.

Ni-Fe films were prepared using a d.c. triode sputtering gun having a pair of magnets for confining the plasma. The triode sputtering apparatus used is illustrated in FIGS. 2 and 3, which show a substrate bias module 10, substrate holder 11, rugged substrate 12, target 13, anode 14, filament 15, target module 16, plasma discharge module 17, igniter module 18, filament module 19, magnets 20 and gas inlet 24.

The composition of the target was 81Ni-19Fe (wt. %) which was nearly zero-magnetostrictive. The sputtered Ni-Fe films had almost the same composition as the target.

(B) Determination of Inert Gas Pressure and Target Voltage

The dependence of magnetic properties of Ni-Fe films on the sputtering condition was studied using flat glass substrates (Corning #0211).

Permalloy films (1 μm) were prepared in an atomosphere of argon gas serving as an inert gas and were checked for magnetic properties to find that the coercive force Hc greatly varied with the target voltage.

Figure 4:
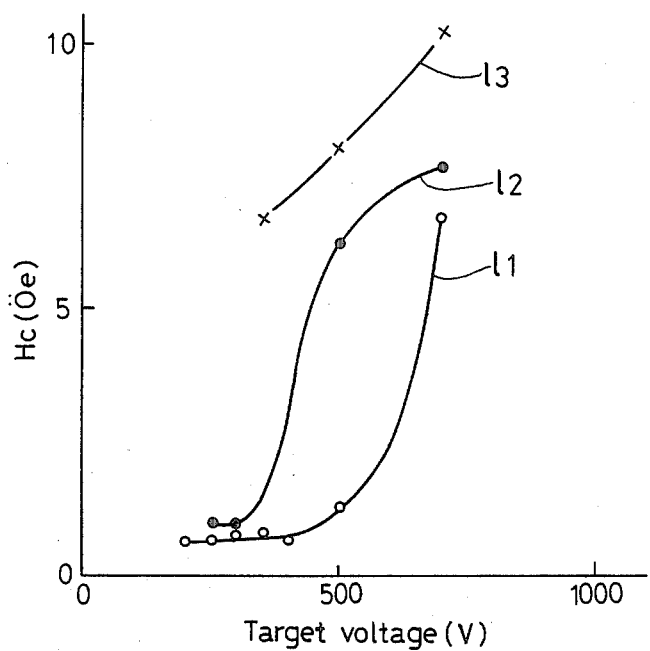
FIG. 4 is a graph showing the relation between the coercive force Hc of Permalloy films and the target voltage, and used in one of Examples for determining the target voltage.

FIG. 4 shows magnetic characteristics curves 11, 12 and 13 obtained at argon gas pressures of 2.5 mtorr, 6.0 mtorr and 9.5 mtorr, respectively. Curves 11 and 12 reveal manifest threshold characteristics as the target voltage increases; the coercive force Hc increases abruptly when the voltage exceeds a threshold value. Curve 13 represents higher coercive force values Hc than curves 11 and 12. When lower in coercive force Hc, the Permalloy film exhibits better magnetic properties, so that the target voltage is to be set to a value below the threshold value (about 300 V), for example, of curve 12 which is dependent on the argon gas pressure. When the target voltage is below the threshold value, the coercive force Hc remains almost unchanged at varying target voltages in the case of the flat substrate. The Permalloy films then obtained are definite in magnetic properties.

Figure 5:
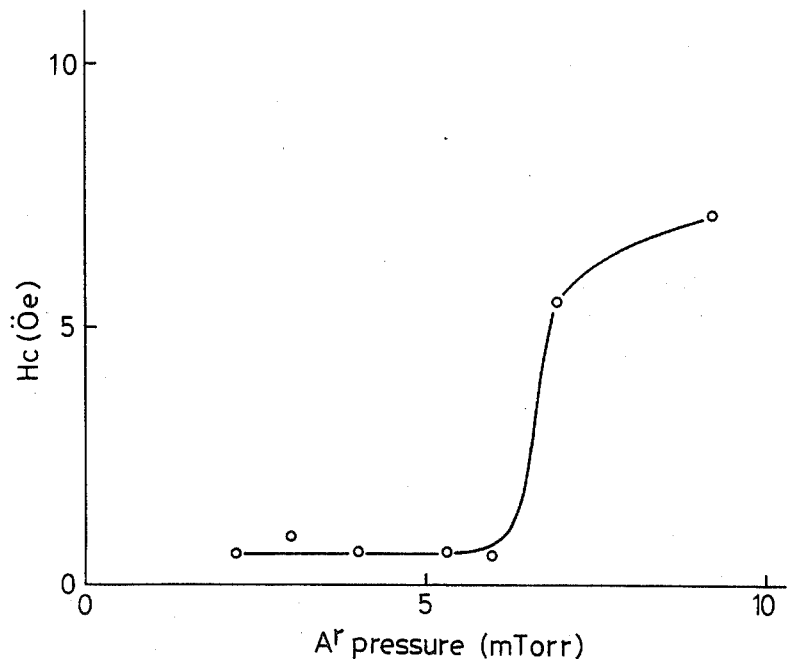
FIG. 5 is a graph showing the relation between the coercive force Hc of Permalloy films and the pressure of an inert gas, and similarly used for determining the inert gas pressure.

FIG. 5 is a characteristics diagram showing the relation between the argon gas pressure and the coercive force Hc as established when the target voltage was set to 300 V for sputtering. The coercive force Hc of the Permalloy film varies markedly when the argon gas pressure exceeds a threshold value. To obtain satisfactory magnetic properties, therefore, it is desirable to set the argon gas pressure to below 6.5 mtorr for sputtering since the the magnetic characteristics curve rises sharply when the gas pressure exceeds this threshold value. Even if the argon gas pressure varies within this range, the Permalloy films obtained are almost definite in the coercive force Hc.

Permalloy films were formed on rugged substrates with the argon gas pressure set to 2.5 mtorr and the target voltage to 300 V based on the above results.

(C) Rugged Substrate

Figure 6:
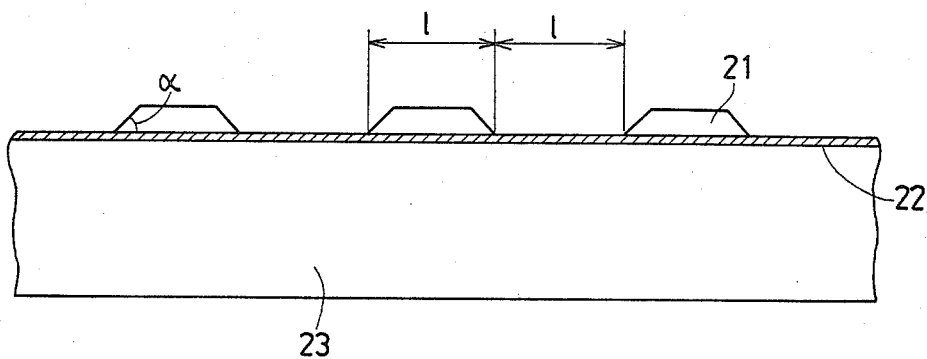
FIG. 6 is a diagram showing the structure of rugged substrates used in Examples.

The rugged substrate used had many grooves with a period of 30 μm (l) and with a sloped sidewall of about 45 deg (α) as shown in FIG. 6. Indicated at 21 in the drawing is an SiO$_2$ layer, at 22 an etching stopper, and at 23 the glass substrate. This substrate was formed by the conventional deposition and etching process. The etching stopper and the SiO$_2$ layer (about 2 μm thick) were formed successively on the flat glass substrate (Corning #0211). The SiO$_2$ layer was then taper-etched by the RIE process using a photoresist for masking.

The substrate was water-cooled during sputtering. The film thickness was about 1 μm. The magnetic properties of the Ni-Fe film were measured by an AC B-H loop tracer at 500 Hz. The structure of the Ni-Fe film was investigated by SEM (scanning electron microscopy) observation and X-ray diffraction measurement.

(D) Determination of Negative Bias Voltage

Figure 7:
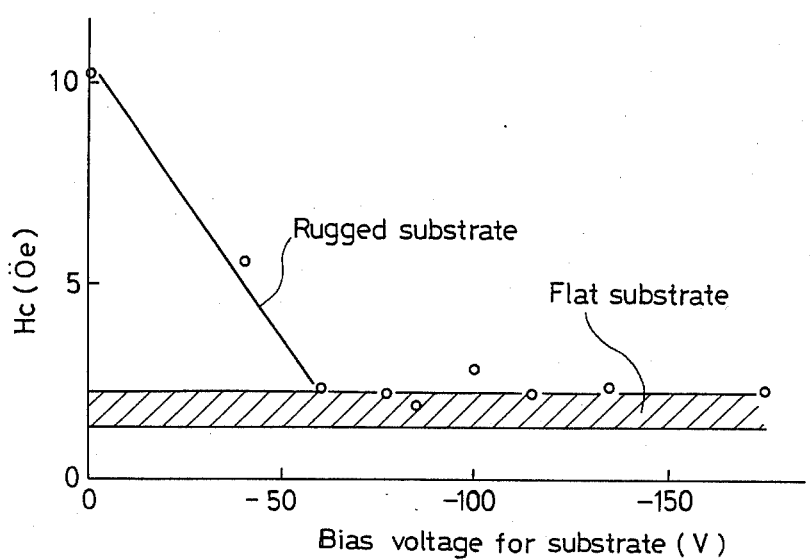
FIG. 7 is a graph showing the relation between the substrate bias voltage and the coercive force of Permalloy films as determined in one of Examples.

FIG. 7 shows the magnetic properties of the Permalloy films formed on the rugged substrate at the same target voltage and argon gas pressure as in the above section (C). More particularly, the diagram shows variations in the coercive force Hc of the Permalloy films formed by varying negative bias voltages to the substrate. At the bias voltage of zero volt which corresponds to the conventional sputtering method, the coercive force Hc is exceedingly greater than that of the Permalloy film on a flat substrate having no slope. However, the coercive force Hc gradually decreases as the substrate bias voltage increases, and the force Hc reaches a constant value when the voltage is a certain value (specific value) or higher. The coercive force Hc thus achieved is comparable to that of the Permalloy on the flat substrate.

The illustrated characteristics indicate that the specific value is 60 V, further revealing that Permalloy films having outstanding magnetic properties can be obtained by applying to the substrate a negative bias voltage not lower than the specific value.

EXAMPLE 2

Figure 8:
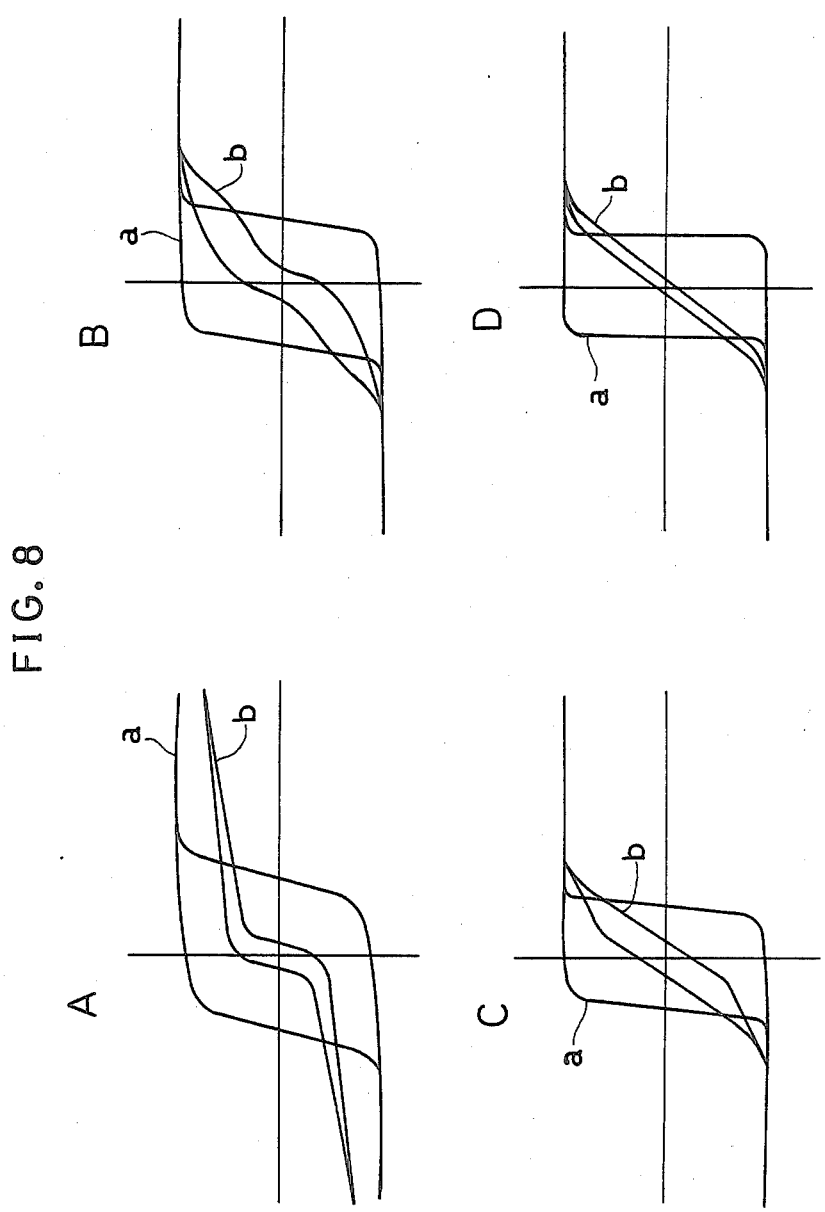
FIGS. 8, A, B, C and D are graphs showing the hysteresis characteristics of Permalloy films at varying substrate bias voltages as determined in the other of Examples.

Permalloy films were prepared in the same manner as in Example 1 except that a flat substrate inclined with an angle of inclination of 40 deg was used and that varying negative bias voltages were applied to the substrate. The magnetic hysteresis characteristics of the films were determined with the results shown in FIGS. 8, A, B, C and D, which represent the characteristics of the Permalloy films formed at negative bias voltages of 0 V, 40 V, 100 V and 175 V, respectively. (The characteristics in the direction of magnetic field are represented by a, and those in the other direction by b.) The diagrams reveal that improved properties are obtained by applying the negative bias voltage, further indicating that outstanding hysteresis characteristics are available at a voltage of at least 100 V.

What we claim is:

1. A process for preparing a soft magnetic film of Permalloy on a rugged substrate in an inert gas atmosphere by a multielectrode sputtering method wherein the target voltage and the target current are independently controllable, the Permalloy film being prepared by:
   (a) setting the inert gas pressure and the target voltage at values below the critical values where the coercive force of the Permalloy film abruptly increases when the film is formed on a flat substrate, and
   (b) applying to the rugged substrate during film formation a negative bias voltage not lower than a specific value determined by an angle of inclination formed by a stepped portion in the rugged substrate.

2. A process as defined in claim 1 wherein the inert gas pressure is set to not higher than 6 mtorr, and the target voltage to not higher than 500 V.

3. A process as defined in claim 1 wherein the inert gas pressure is set to 2 to 4 mtorr, and the target voltage to 200 to 400 V.

4. A process as defined in claim 1 wherein the negative bias voltage is 60 to 100 V.

5. A process as defined in claim 1 wherein the multielectrode sputtering method is a d.c. triode sputtering method or d.c. tetrode sputtering method.

6. A process as defined in claim 1 wherein the inert gas is argon gas.

7. A process as defined in claim 1 wherein the Permalloy is Ni-Fe two-element Permalloy or a multi-element Permalloy prepared by adding the third element of Mo, Ti, Cr, V or Nb to Ni-Fe.

8. A process as defined in claim 1 wherein the rugged substrate is a magnetic substrate of Ni-Fe ferrite or Mn-Zn ferrite or a nonmagnetic substrate having a Permalloy or Sendust layer.

* * * * *